(12) United States Patent
Tsushima et al.

(10) Patent No.: US 6,909,818 B2
(45) Date of Patent: Jun. 21, 2005

(54) OPTOELECTRONIC PACKAGING SUBSTRATE AND PRODUCTION METHOD OF THE SAME

(75) Inventors: Hiroshi Tsushima, Takatsuki (JP); Takeshi Oka, Kobe (JP)

(73) Assignee: Nippon Paint Co., Ltd., Osaka (JP)

( * ) Notice: Subject to any disclaimer, the term of this patent is extended or adjusted under 35 U.S.C. 154(b) by 194 days.

(21) Appl. No.: 10/453,693

(22) Filed: Jun. 4, 2003

(65) Prior Publication Data

US 2004/0005109 A1 Jan. 8, 2004

(30) Foreign Application Priority Data

Jun. 4, 2002  (JP) ........................................ 2002-163398

(51) Int. Cl.[7] .................................................. G02B 6/12
(52) U.S. Cl. ......................................... 385/14; 385/131
(58) Field of Search ............................ 385/14, 88, 131, 385/132

(56) References Cited

U.S. PATENT DOCUMENTS 5,347,601 A * 9/1994 Ade et al. ..................... 385/3
6,027,254 A * 2/2000 Yamada et al. .............. 385/88
6,031,945 A * 2/2000 You et al. ..................... 385/14

OTHER PUBLICATIONS

JP 10–326957, A and English abstract thereof.
JP 6–22234, A and English abstract thereof.
JP 6–291273, A and English abstract thereof.
JP 7–114188, A and English abstract thereof.
JP 5–72694, A and English abstract thereof.
JP 57–11339, A and English abstract thereof.

* cited by examiner

*Primary Examiner*—Akm Enayet Ullah
*Assistant Examiner*—Jennifer Doan
(74) *Attorney, Agent, or Firm*—Townsend & Banta

(57) ABSTRACT

The present invention provides an optoelectronic packaging substrate comprising optical wiring having an optical waveguide and electric wiring having a metal wiring and characterized in that the optical waveguide is composed of a core layer, a side face clad layer formed in the side circumference of the core layer, an upper clad layer formed on the upper side of the core layer and the side face clad layer, and a lower clad layer formed on the lower side of the core layer and the side face clad layer; that the metal wiring is formed in at least one of the side face clad layer, the upper clad layer, and the lower clad layer; and that the core layer, the side face clad layer, and the clad layer bearing the metal wiring are made of a silicon-based material layer of a branched type polysilane mixed with a silicone compound.

19 Claims, 2 Drawing Sheets

OPTOELECTRONIC PACKAGING SUBSTRATE AND PRODUCTION METHOD OF THE SAME

BACKGROUND OF THE INVENTION

1. Field of the Invention

The present invention relates to an optoelectronic packaging substrate provided with optical wiring having an optical waveguide and electric wiring and useful in electric, electronic, and communication fields and its production method.

2. Related Art

Polysilanes are polymers very attractive in terms of metallic property and non-localization of electrons of silicon as compared with carbon, as well as high heat resistance and excellent thin film formability and utilization of such polysilanes leads to production of highly conductive materials by a method for doping iodine, a method for doping ferric chloride, and the like. Further, for the purpose to develop photoresist for forming various fine patterns with high precision, investigations into the use of the polysilanes have been actively preformed and many proposal have been disclosed in, for example, Japanese Patent Publication Laid Open Nos. H6-291273 and H7-114188.

Further, in Japanese Patent Publication Laid Open No. H5-72694 is disclosed a method for fabricating semiconductor integrated circuits by using a polysilane. This method is characterized in that a polysilane or a polysilane film doped with iodine or the like is used as a conductive layer and a siloxane film converted from the polysilane by light radiation is used as an insulating layer and in such a manner, it has been tried to use a polymer having Si—Si bonds for a conductive material.

However, with respect to a semiconductor integrated circuit obtained by the foregoing method, sufficient conductivity of a conductive part cannot be provided only by a polysilane and also, use of corrosive iodine or the like causes significant inverse effects in the case of applications to electronic materials and attributed to the utilization of the polysilane itself, which is easily converted into siloxane by water in atmospheric air, oxygen, light and the like, as a conductive material, it has been extremely difficult to use the polysilane for electronic materials especially required to have reliability.

Further, Japanese Patent Publication Laid Open No. S57-11339 discloses a method for forming a metal image by exposing a compound having Si—Si bonds and then bringing the compound into contact with a metal salt solution. Based on the reduction of the metal salt to a metal by contact of the compound having Si—Si bonds with the metal salt solution, the method forms a metal layer in the unexposed part.

Also, according to Japanese Patent Publication Laid Open No. H10-326957 disclosed is a method for forming metal patterns by radiating light to a film of a solely polysilane, doping the exposed parts with a palladium salt, which is a catalyst for electroless plating, and carrying out electroless plating using the catalyst in the exposed parts. However, a polysilane film, in general, has high crystallinity and becomes a hard and fragile film, so that even if such metal patterns are formed, the metal patterns are inferior in adhesion strength and thus no practically usable metal pattern can be formed. Moreover, since the plated portions are grown on the surface of the polysilane film, they become uneven and in the case of application to multilayered built-up substrate, multi-chip module substrate, and the like, surface smoothing treatment is required to result in setback for practical use.

Meanwhile, based on the fact that bond scission of polysilane occurs easily by UV radiation, electron beam radiation, or the like and consequently the refractive index is decreased, application of a polysilane to an optical waveguide is disclosed in Japanese Patent Publication Laid Open No. H6-22234. The process of forming the waveguide only by light radiation can shorten the process time and make the production easy, however the linear polysilane described there is extremely physically fragile owing to the high crystallinity and in the case of use it for an optical waveguide, the loss is high owing to light dispersion. Moreover, it is difficult in terms of physical property and surface smoothness to form electric wiring by plating in the foregoing manner simultaneously with the optical waveguide.

Similarly, investigations into practical application of polymer materials for photoelectric compound mounting substrates have been made by using polyimide type materials. The investigations include methods for producing optoelectronic packaging substrates by forming a fluorinated polyimide, which has been found actual usable for optical waveguides, on semiconductor substrate and then separating an optical waveguide portion, and laminating it on an electric circuit substrate. The optical waveguide of the fluorinated polyimide requires an etching step in vacuum and the size or the like of the substrate is therefore limited to make the method not practical. Further, since the electric wiring is to be formed by a conventional etching method using a copper foil, there is limit in terms of mounting with a high density and as a result, the method has many problems as a technique to deal with high frequency for the photoelectric wiring compound mounting.

A technology for simultaneously forming an optical waveguide, electric wiring, and electronic parts such as a capacitor and the like in a single substrate requires a material for the optical waveguide and a material for electric wiring to similarly satisfy properties such as high transparency, low light loss, high electric insulation, and low dielectric constant and any conventional techniques and materials have not been satisfactory.

SUMMARY OF THE INVENTION

The purpose of the present invention is to provide an optoelectronic packaging substrate in which optical wiring having an optical waveguide and electric wiring of metal wiring are formed and which comprises the optical wiring and the electric wiring with high patterning precision and is excellent in smoothness and to provide a method for producing such an optoelectronic packaging substrate by simple process.

An optoelectronic packaging substrate of the present invention comprises optical wiring having an optical waveguide and electric wiring of metal wiring and is characterized in that the optical waveguide is composed of a core layer, a side face clad layer formed in the side circumference of the core layer, an upper clad layer formed on the upper side of the core layer and the side face clad layer, and a lower clad layer formed on the lower side of the core layer and the side face clad layer and the metal wiring is formed in at least one of the side face clad layer, the upper clad layer, and the lower clad layer and the core layer, the side face clad layer, and the clad layer bearing the metal wiring are made of a silicon-based material layer of a branched type polysilane containing a silicone compound.

In the present invention, the core layer and the side face clad layer may be formed by making the refractive index of a region corresponding to the side face clad layer in the foregoing silicon-based material layer lower than that of a region corresponding to the core layer by exposing selectively the former region.

Further, the metal wiring may be formed by depositing a metal on the clad layer by electroless plating. Practically, a region to form the metal wiring thereon is selectively exposed, a metal with a lower normal electrode potential than that of a metal to be deposited on the region by electroless plating is selectively adsorbed on the region, and after that, the object metal is selectively deposited on the region by electroless plating to form the metal wiring.

In the process for forming the metal wiring, the metal wiring may be formed by forming a recessed part by developing and etching the selectively exposed part and depositing the object metal in the recessed part by electroless plating.

Further, with respect to an optoelectronic packaging substrate of the present invention, a dielectric material doped part in which a metal oxide having a high dielectric constant is adsorbed is formed and the dielectric material doped part may be used as an electronic part of a capacitor or the like. The dielectric material doped part may be formed in at least one of the side face clad layer, the upper clad layer, and the lower clad layer.

The dielectric material doped part may be formed by exposing selectively a region to form the dielectric material doped part therein in the silicon-based material layer and selectively adsorbing a metal oxide in the region.

The silicon-based material layer in the present invention may further contain a photosensitive acid generating agent. The content of the photosensitive acid generating agent is preferably 1 to 5.5% by weight in the polysilane.

In the present invention, the silicon-based material layer may further contain a peroxide. The content of the peroxide is preferably 1 to 10% by weight in the polysilane.

The content of the silicone compound in the silicon-based material layer of the present invention is preferably 40 to 90% by weight in the polysilane.

Further, in the present invention, the lower clad layer maybe formed on a substrate or a sheet of a semiconductor, glass, a magnetic body, a plastic or a their compound material. That is, an optoelectronic packaging substrate of the present invention may be formed on such a substrate or sheet.

A method for producing an optoelectronic packaging substrate of the present invention is a method for producing the foregoing optoelectronic packaging substrate of the present invention and involves steps of forming a silicon-based material layer of a branched type polysilane mixed with a silicone compound on a lower clad layer, exposing a selected part of the silicon-based material layer to make the exposed part be a side face clad layer and the unexposed part be a core layer, forming an upper clad layer on the side face clad layer and the core layer, and forming metal wiring with a prescribed pattern by depositing a metal on at least of the lower clad layer, the side face clad layer, and the upper clad layer by electroless plating after formation of the clad layer and before formation of another layer thereon.

The step of forming the metal wiring is preferably carried out by exposing selectively a region of a clad layer to form the metal wiring thereon, selectively adsorbing a metal with a lower normal electrode potential than that of a metal to be deposited by electroless plating on the region, and then depositing the metal selectively on the region by electroless plating. Further, the step of forming the metal wiring preferably further involves steps of forming a recessed part by developing and etching a selectively exposed part of a clad layer by using an organic solvent or an alkaline solution and depositing a metal in the recessed part by electroless plating.

A production method of the present invention may further involves a step of forming a dielectric material doped part in a clad layer. That is, the production method may further involves a step of forming a dielectric material doped part adsorbing a metal oxide having a high dielectric constant in at least one of the lower clad layer, the side face clad layer, and the upper clad layer after formation of the clad layer and before formation of another layer thereon.

The step of forming the dielectric material doped part is preferable to involve steps of exposing selectively a region to form the dielectric material doped part thereon in the clad layer and selectively adsorbing a metal oxide in the region.

A production method of the present invention may further involve a step of forming the lower clad layer on a substrate or a sheet of a semiconductor, glass, a magnetic body, a plastic or a their compound material. That is, the production method of the present invention may involve a step of forming an optoelectronic packaging substrate of the present invention on such a substrate or sheet.

DESCRIPTION OF THE PREFERRED EMBODIMENTS

Figure 1:
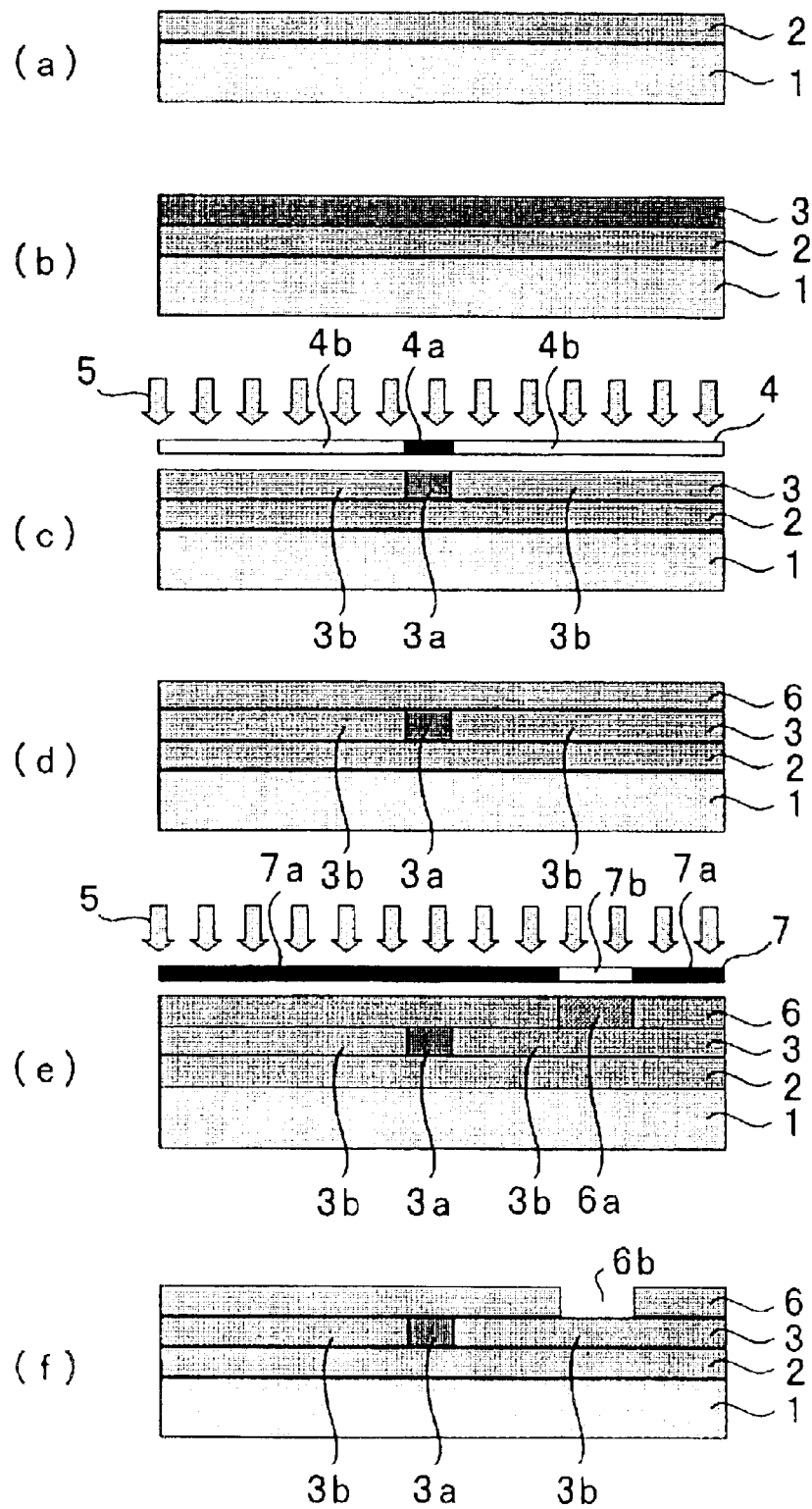
FIGS. 1A to 1F are cross-sectional views of one example of steps of producing an optoelectronic packaging substrate of the present invention.

In the present invention, a core layer, a side face clad layer, and a clad layer bearing metal wiring are silicon-based material layers of a branched type polysilane containing a silicone compound. Further, the silicon-based material layers may contain a photosensitive acid generating agent and/or a peroxide.

Hereinafter, the branched type polysilane, the silicone compound, the photosensitive acid generating agent, and the peroxide will be described.

[Branched Type Polysilane]

A polysilane to be used in the present invention does not include linear ones but branched ones. The branched type and the straight chain type are distinguished depending on the bonding state of Si atoms contained in a polysilane. A branched type polysilane is a polysilane containing Si atoms each forming 3 or 4 (the number of bonds) bonds with neighboring Si atoms. On the other hand, with respect to a straight chain type polysilane, the number of bonds of each Si atom with neighboring Si atoms is 2. In general, since the valence of Si atom is 4, Si atoms existing in a polysilane and having 3 or less bonds are bonded with hydrocarbon groups, alkoxy groups or hydrogen atoms. Such hydrocarbon groups are preferably aliphatic hydrocarbon groups with 1 to 10 carbons and aromatic hydrocarbon groups with 6 to 14 carbons, which may be substituted with halogens. Practical examples of the aliphatic hydrocarbon groups are straight chain groups such as methyl, propyl, butyl, hexyl, octyl, decyl, trifluoropropyl, and nonafluorohexyl and the like and alicyclic groups such as cyclohexyl, methylcyclohexyl and the like. Practical examples of the aromatic hydrocarbon groups are phenyl, p-tolyl, biphenyl, and anthracyl and the like. The alkoxy groups include those with 1 to 8 carbons. Practical examples are methoxy, ethoxy, phenoxy, octyloxy and the like. In consideration of the synthesis easiness, methyl and phenyl are especially preferable among them. Further, in the case the refractive index is adjusted by the polysilane structure, a high refractive index can be provided by introducing diphenyl and a low refractive index can be provided by increasing dimethyl groups.

The branched type polysilane is preferable to contain 2% or more Si atoms with 3 or 4 bonds with neighboring Si atoms in all Si atoms of the branched type polysilane itself. A branched type polysilane with less than 2% ratio or of the straight chain type has high crystallinity and is easy to produce microcrystal grains in a film and it results in diffusion and degradation of the transparency.

A polysilane, to be employed in the present invention can be produced by condensation polymerization of a halogenated silane compound by heating at 80° C. or higher in an organic solvent such as n-decane, toluene and the like in the presence of an alkali metal such as sodium. Further, the production may be carried out by electrolytic polymerization or a method using a metal magnesium and a metal chloride.

In the case of a branched type polysilane, an aimed branched type polysilane can be produced by condensation polymerization by heating a halosilane compound mixture containing an organotrihalosilane compound, a tetrahalosilane compound, and a diorganodihalosilane compound and having 2% by mole or more of the organotrihalosilane compound and the tetrahalosilane compound in the entire amount. In this case, the organotrihalosilane compound becomes a Si atom source providing Si atoms having 3 bonds with neighboring Si atoms, meanwhile the tetrahalosilane compound becomes a Si atom source providing Si atoms having 4 bonds with neighboring Si atoms. The network structure can be confirmed by measuring the UV absorption spectra or nuclear magnetic resonance spectra.

The halogen atoms of the organotrihalosilane compound, the tetrahalosilane compound, and diorganodihalosilane compound to be used as the raw materials of a polysilane are preferably chlorine atoms. Substituent groups other than the halogen atoms of the organotrihalosilane compound and diorganodihalosilane compound include the above-mentioned hydrocarbon groups, alkoxy group, or hydrogen.

The branched type polysilane is not particularly limited if it is soluble in an organic solvent and capable of forming a transparent film by application. As such an organic solvent, those of hydrocarbon type with 5 to 12 carbons, halogenated hydrocarbon type, and ether type are preferable.

Examples of the hydrocarbon type are pentane, hexane, heptane, cyclohexane, n-decane, n-dodecane, benzene, toluene, xylene, methoxybenzene and the like. Examples of the halogenated hydrocarbon type are tetrachlorocarbon, chloroform, 1,2-dichloroethane, dichloromethane, chlorobenzene and the like. Examples of the ether type are diethyl ether, dibutyl ether, tetrahydrofuran and the like.

If a branched type polysilane compound with 2% or higher branch degree is used as the branched type polysilane, the higher the branch degree is, the more the light transmissivity can be increased. Further, those subjected to hydrogenation with heavy hydrogen, partial or entire halogenation, especially, fluorination can be used. Accordingly, absorption of light with specified wavelength can be suppressed, the light transmissivity can be made high in a wide range of wavelength, the refractive index alteration with high sensitivity and high precision is made possible by UV radiation and further thermal stability of the refractive index can be improved.

[Silicone Compound]

Practical examples of a silicone compound to be used in the present invention include those having the following general formula:

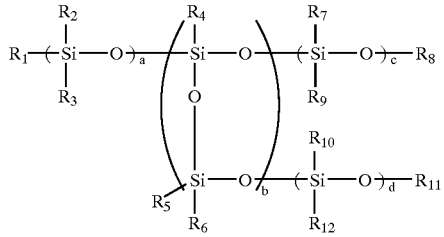

[in the formula, $R_1$ to $R_{12}$ separately denote a group selected from aliphatic hydrocarbon groups with 1 to 10 carbons which may be substituted with a halogen or a glycidyloxy group, aromatic hydrocarbon groups with 6 to 12 carbons, and alkoxy groups with 1 to 8 carbons and may be similar or dissimilar to one another; a, b, c, and d separately denote an integer including 0 and satisfy $a+b+c+d \geq 1$.].

Practically, those produced by hydrolytic condensation of 2 or more types of dichlorosilanes, so-called D body, having two organic substituent groups and trichlorosilanes, so-called T body, having one organic substituent can be exemplified.

Practical examples of the aliphatic hydrocarbon groups which the silicone compound has are straight chain type groups such as methyl, propyl, butyl, hexyl, octyl, decyl, trifluoropropyl, glycidyloxypropyl and the like and alicyclic type groups such as cyclohexyl, methylcyclohexyl and the like. Practical examples of the aromatic hydrocarbon groups are phenyl, p-tolyl, biphenyl and the like. Practical examples of the alkoxy groups are methoxyl, ethoxy, phenoxy, octyloxy, tert-butoxy and the like.

The foregoing types of $R_1$ to $R_{12}$ and the values of a, b, c, and d are not particularly important and any may be selected if the silicone compound is compatible with a polysilane and an organic solvent and a film to be obtained is transparent. In consideration of the compatibility, it is preferable to contain hydrocarbon groups same as those which a polysilane to be used have. For example, in the case a polysilane of phenylmethyl type is used, it is preferable to use a silicone compound of a similar phenylmethyl type or diphenyl type. Further, just like those having alkoxy groups with 1 to 8 carbons for at least 2 of $R_1$ to $R_{12}$, silicone compounds having two or more alkoxy groups can be used as cross-linking agents. As examples of such silicone compounds, methylphenylmethoxysilicone, phenylmethoxysilicone and the like can be exemplified.

Those having a molecular weight of not more than 10,000, preferably not more than 3,000, are preferable to be used.

Further, those subjected to hydrogenation with heavy hydrogen, partial or entire halogenation, especially, fluorination can be used, so that absorption of light with specified wavelength can be suppressed, the light transmissivity can be made high in a wide range of wavelength, the refractive index alteration with high sensitivity and high precision is made possible by UV radiation and further thermal stability of the refractive index can be improved.

[Photosensitive Acid Generating Agent and Peroxide]

A photosensitive acid generating agent is not particularly limited if it is a compound capable of generating an acid by light, and 2,4,6-tris(trihalomethyl)-1,3,5-triazine and its derivatives having substituent groups at the 2nd site or the 2nd and 4th sites can be exemplified. The substituent groups contained in these compounds are aliphatic and aromatic hydrocarbon groups which may have substituent groups. In general, triazine having trichloromethyl can be used. Addition of a photosensitive acid generating agent is based on that Si—Si bonds can be efficiently cut by halogen radicals and an acid produced by them.

A peroxide is not particularly limited if it can efficiently insert oxygen into the Si—Si bonds and peroxyester type compounds such as 3,3',4,4'-tetra(tert-butyl peroxycarbonyl) benzophenone can be exemplified.

[Production Process]

Hereinafter, the process for producing an optoelectronic packaging substrate of the present invention will be described. FIGS. 1A to 1F and FIGS. 2G to 2J are cross-sectional views showing examples of the process for producing an optoelectronic packaging substrate of the present invention.

As shown in FIG. 1A, a lower clad layer 2 is formed on a substrate 1. In the case metal wiring and/or a dielectric material doped part is formed on the lower clad layer 2, the lower clad layer 2 is formed by using a silicon type material of a branched type polysilane containing a silicone compound. In the case no metal wiring or the like is formed, any material may be used for the formation if it has a lower refractive index than that of a core layer.

As shown in FIG. 1B, next, a silicon type material layer 3 is formed on the lower clad layer 2. The silicon type material layer 3 is made of a silicon type material of a branched type polysilane containing a silicone compound. The silicon type material may contain an epoxy type resin, a photosensitive acid generating agent, a peroxide, or the like. Because of high transparency, especially an epoxy resin having fluorene skeleton is preferably used as the epoxy type resin.

As shown in FIG. 1C, next, a photomask 4 is put on the silicon type material layer 3 and energy beam 5 such as UV rays or the like is radiated to prescribed portions. The photomask 4 has non-transmission portions 4a and transmission portions 4b and the energy beam 5 is radiated only the portions of the silicon type material layer 3 corresponding to the transmission portions 4b. In the portions to which the energy beam is radiated, Si—Si bonds of the polysilane are cut to result in decrease of the refractive index. Accordingly, the refractive index in the exposed parts 3b becomes lower than that in the unexposed parts 3a. Consequently, a core layer 3a and a side face clad layer 3b are formed.

As shown in FIG. 1D, next, an upper clad layer 6 is formed on the core layer 3a and the side face clad layer 3b. In this example, since metal wiring and dielectric material doped parts are to be formed in this upper clad layer 6, the layer 6 is made of a silicon type material of a branched type polysilane containing a silicone compound. It is required for the upper clad layer 6 to have a lower refractive index than that of the core layer 3a. Therefore, for example, a polysilane and/or a silicone compound each having a low refractive index is employed to form the silicon type material layer having a lower refractive index than that of the core layer 3a. Incidentally, if no metal wiring or dielectric material doped parts are formed in the upper clad layer 6, a material other than the silicon type material may be utilized to form a layer having a lower refractive index than that of the core layer 3a.

As described above, the core layer 3a, the side face clad layer 3b, the lower clad layer 2, and the upper clad layer 6 are formed to compose an optical waveguide.

Next, metal wiring and dielectric material doped parts are formed in the upper clad layer 6 as follows.

As shown in FIG. 1E, a photomask 7 is put on the upper clad layer 6. The photomask 7 has transmission parts 7b in portions corresponding to the regions were the metal wiring is to be formed and non-transmission parts 7a in the rest of the portions. Energy beam 5 such as UV rays is radiated through the photomask 7 to selectively expose the regions of the upper clad layer 6 corresponding to the transmission parts 7b. Accordingly, Si—Si bonds of the polysilane in the exposed parts 6a of the upper clad layer 6 are cut and Si atoms whose bonds are cut are bonded with oxygen to form silanol groups (Si—OH) and subsequently, a hydrophilic polysilane is formed.

As shown in FIG. 1F, next, the exposed parts of the hydrophilic polysilane are developed and etched by a solvent or an alkaline solution to form recessed parts 6b. Incidentally, parts of the polysilane made to be hydrophilic remain in the surface of the recessed parts 6b.

Figure 2:
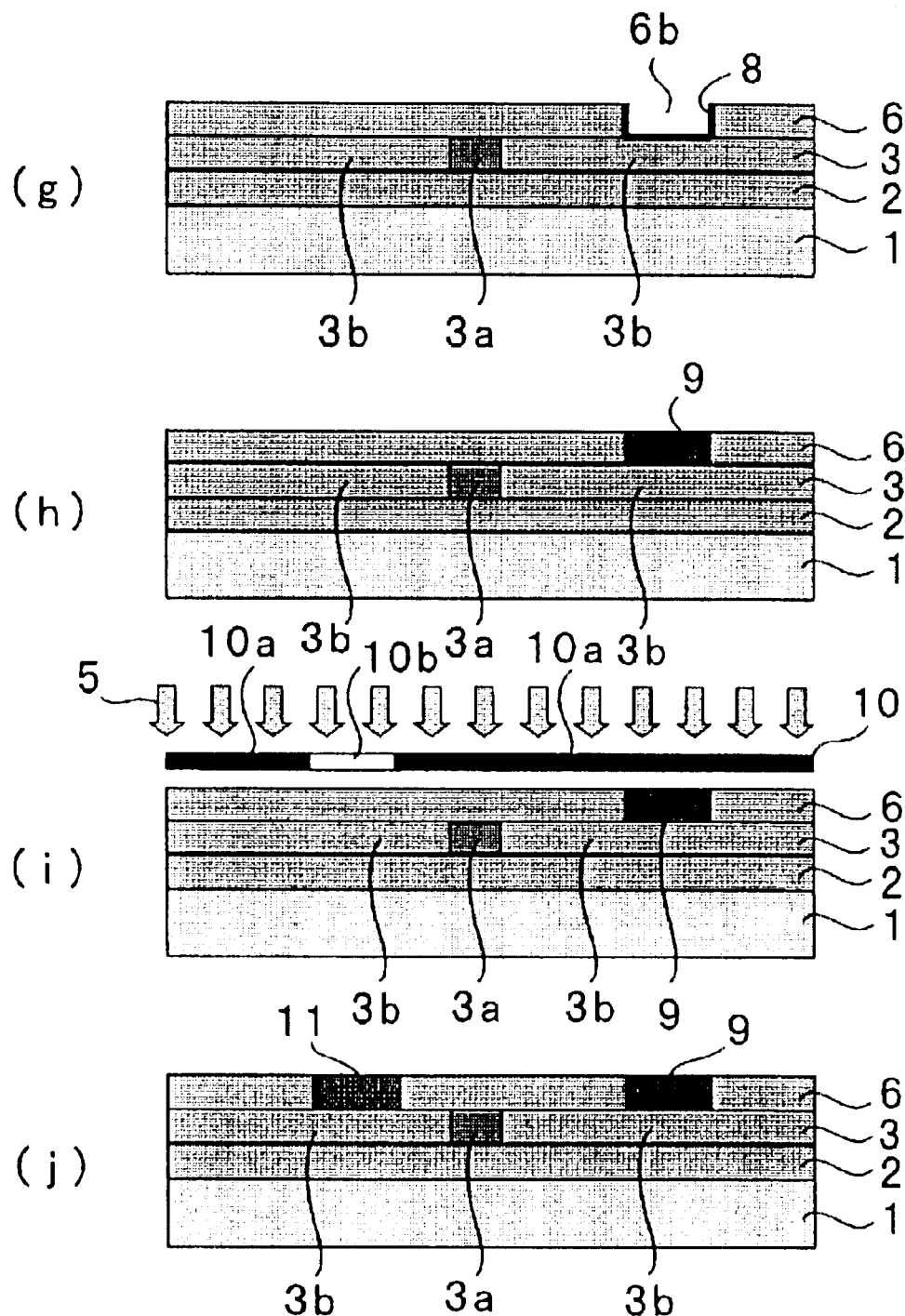
FIGS. 2G to 2J are cross-sectional views of another example of steps of producing an optoelectronic packaging substrate of the present invention.

As shown in FIG. 2G, next, the recessed parts 6a are brought into contact with an aqueous solution of a metal salt of which the metal has a lower normal electrode potential than that of a metal to be deposited by electroless plating in the next step. Practically, contact with an aqueous solution of a noble metal salt is carried out. The noble metal salt is easily reduced by the silanol groups in the surface, metal particles are produced, and the metal particles are adsorbed on the surface of the recessed parts 6a to form an adsorption layer 8.

As shown in FIG. 2H, next the recessed parts 6a bearing the adsorption layer 8 are brought into contact with an electroless plating solution to deposit a metal in the recessed parts 6a by electroless plating and form metal wiring 9.

In such a manner as described above, the metal wiring can be formed on the upper clad layer 6. Next, dielectric material doped parts are to be formed on the upper clad layer 6 as follows.

As shown in FIG. 2I, on the upper clad layer 6 is put a photomask 10. The photomask 10 has transmission parts 10b in the portions corresponding to the regions where the dielectric material doped parts are to be formed and non-transmission parts 10a in the rest of the portions. Energy beam 5 such as UV rays or the like is radiated through the photomask 10 to the upper clad layer 6. Since hydrophilic polysilane having silanol groups in the surface is formed in the exposed parts, the parts are brought into contact with an aqueous solution in which a metal oxide with a high dielectric constant is dispersed to adsorb the metal oxide and form the dielectric material doped parts 11 as shown in FIG. 2J.

In such a manner as described above, the metal wiring 9 and the dielectric material doped parts 11 can be formed in the upper clad layer 6.

In the above-mentioned example, the recessed parts 6b are formed in the upper clad layer 6 and the recessed parts 6b are filled with a metal by the electroless method to form the metal wiring, however the metal may be deposited on the exposed parts 6a without forming the recessed parts 6b by the electroless method to form the metal wiring.

Further, the metal wiring and the dielectric material doped parts may be formed in the lower clad layer 2 or the side face clad layer 3b. In such a case, the metal wiring or the dielectric material doped parts are formed before another layer is formed thereon.

Further, the above-mentioned steps may be repeated a plurality of times to stack a plurality of layers of core layers and clad layers. Accordingly, similarly to a common built-up substrate, optical wiring and metal wiring can be formed in layers. Moreover, the unnecessary parts can be removed by exposure and development in a similar manner to that for the step of forming the recessed parts 6b as described above.

In the present invention, a core layer and a clad layer are preferable to have a refractive index difference of 0.5% or higher between them. If the refractive index being kept higher than that of a clad layer, the core layer may be radiated with energy beam such as UV rays.

As the branched type polysilane to be employed for the present invention, those having atoms bonded with hydrocarbon groups, alkoxy groups, and hydrogen atoms other than Si atoms may be used. Further, branched type polysilanes having branch degree of 2% or higher are preferable to be employed.

A silicone compound to be employed in the present invention is preferable to have cross-linking property and preferable to have alkoxy groups. Also it is preferable to add 40 to 90% by weight of a silicone compound to the polysilane.

As a photosensitive acid generating agent is preferable a trichloromethyl triazine type photosensitive acid generating agent to be employed and it is preferable to add not less than 1% by weight and not more than 5.5% by weight to the polysilane.

As a peroxide is preferable a peroxyester type peroxide to be employed and it is preferable to add not less than 1% by weight and not more than 10% by weight to the polysilane. Also is preferable an epoxy resin compatible with the polysilane to be added thereto as described above.

In the present invention, it is preferable to form a silicon-based material layer by dissolving a silicon-based material of a polysilane containing a silicone compound in an organic solvent, applying the solution to a substrate and then curing the silicon-based material by heating at a temperature not lower than 100° C. and not higher than 500° C. Practical examples of the solvent to dissolve the polysilane therein preferably include aromatic hydrocarbons such as benzene, toluene, xylene, and methoxybenzene and ester type solvents such as tetrahydrofuran, dibutyl ether and the like. The use amount of a solvent is preferable to adjust the concentration of a polysilane in a range of 20 to 70% by weight.

By heating treatment at 300° C. or higher, the organic substituent groups in the side chains of a polysilane are decomposed and become inorganic, so that the C—H absorption in a near IR region can be lowered and consequently, the absorption loss as an optical waveguide can be lowered to 0.1 dB/cm or lower. Further, by heating treatment at 300° C. or higher, the refractive index can be stabilized without being changed up to such a temperature and soldering heat resistance can be simultaneously satisfactory. Accordingly, a desirable optoelectronic packaging substrate can be obtained.

The thickness of a core layer and clad layers in the present invention is preferably 0.01 to 1,000 μm, especially preferably 3 to 30 μm.

According to the present invention, an optoelectronic packaging substrate with extremely low temperature coefficient of refractive index up to a temperature as high as 300° C. or higher can be obtained. That is owing to use of a branched type polysilane and addition of a silicone compound with a high light transmissivity to the polysilane. Especially, use of a branched type polysilane with branch degree of 2% or higher can decrease light transmission loss. Further, heating treatment of a silicon-based material layer makes the silicon-based material layer be inorganic and accordingly, the light transmission can be further decreased.

According to the present invention, since an optical waveguide with a three-dimensional structure and a refractive index difference between a core layer and a clad layer of at least 0.5% can be easily formed, the unevenness in the structure is little as compared with that of a polymer wave guide formed by a conventional etching method and thus the light dispersion loss can be suppressed to low.

A silicon-based material in the present invention can be easily and evenly dissolved in an organic solvent such as toluene. Therefore, a core layer and a clad layer made of the silicon-based material layer can be almost free from slight light scattering loss and be layers with low loss. Accordingly, if UV rays and the like are radiated to such a layer through a photomask, the patterns can be transferred with an extremely high precision and the interface between a core layer and a clad layer can be even. Consequently, an optical waveguide with little light dispersion loss can be accomplished.

Further, with respect to a silicon-based material layer in the present invention, addition of a photosensitive acid generating agent and a peroxide makes it possible to control the refractive index to UV ray radiation to be a desired value. The sensitivity of refractive index alteration to UV radiation can be also improved.

Further, both of a core layer and a clad layer can be formed by using a silicon-based material. Accordingly the evenness and the adhesion strength of the interface between a core layer and a clad layer can be improved and occurrence of microcracking owing to difference of thermal expansion coefficient values or the like can be suppressed.

[Exposure to Silicon-based Material Layer]

Energy beam to be radiated to a silicon-based material layer includes x-rays, electron beam, UV rays and the like and especially UV rays are preferable to be employed. As a light source of UV rays, light sources with continuous spectra such as a hydrogen discharge tube, a rare gas discharge tube, a tungsten lamp, a halogen lamp and the like and light sources with discontinuous spectra such as various type laser, a mercury lamp and the like can be employed. As the laser, He—Cd laser, Ar laser, YAG laser, excimer laser and the like can be employed. As the light source, among them is preferable a mercury lamp since it is economical and easy to handle.

UV rays preferable to be radiated are preferable to be UV rays with wavelength in a range of 250 to 400 nm, which is a σ–σ* absorption region of a polysilane. The radiation dose is preferably 0.1 to 10 J/cm$^2$, further preferably 0.1 to 1 J/cm$^2$, per 1 μm thickness of a photosensitive layer.

[Formation of Metal Wiring]

In the present invention, energy beam such as UV rays or the like is selectively radiated to a silicon-based material layer and metal wiring is formed on the exposed parts. Silanol groups are formed in the exposed parts and therefore, the exposed parts are changed from non-polar to polar and made to be hydrophilic. Based on the necessity, recessed parts are formed in the exposed parts made hydrophilic by developing and etching. In the case of development using an aqueous alkaline solution, as the aqueous alkaline solution is used an aqueous solution of an amine such as tetramethylammonium hydroxide (TMAH), an inorganic base such as sodiumhydroxide, and the like. Especially, an aqueous solution of 2.4% by weight of TMAH is preferable to be used. Such an aqueous solution may further contain an alcohol type solvent for the purpose to swell the exposed parts of the silicon-based material layer.

In the case of carrying out development by a solvent, an alcohol type solvent in which unexposed parts of the silicon-based material layer are not dissolved is preferable to be used. For example, butanol, ethanol, isopropyl alcohol and the like can be preferably used.

A hydrophilic polysilane left without being removed by development remains in the recessed parts. The hydrophilic polysilane is brought into contact with a solution of a metal salt of which the metal has a lower normal electrode potential than that of a metal to be deposit by contacting an electroless plating solution to reduce the metal with a lower normal electrode potential and adsorb the metal therein.

The solution containing a metal salt of which the metal has a lower normal electrode potential (hereinafter referred to as a metal salt with a lower normal electrode potential) than that of a metal to be deposit by contacting an electroless plating solution is not particularly limited if the solution is a metal salt-containing solution to be used for pretreatment for an electroless plating solution, however in general, those containing a noble metal such as gold, silver, platinum, palladium or the like in form of a salt may be employed and sold in markets as catalyst-providing agents in markets and are thus made easily available. As such a catalyst, many solutions containing a silver salt or a palladium salt are used. A metal salt compound is generally defined as $A\text{-}Z_n$ (n denotes the valence of A) wherein A stands for a metal and Z stands for, for example, a halogen atom such as Cl, Br, and I or acetate, trifluoroacetate, acetylacetonate, carbonate, perchlorate, nitrate, sulfonate, oxide and the like. Practical examples of a palladium salt compound are $PdCl_2$, $PdBr_2$, $PdI_2$, $Pd(OCOCH_3)_2$, $Pd(OCOCF_3)_2$, $PdSO_4$, $Pd(NO_3)_2$, PdO and the like.

A solution containing a metal salt with a lower normal electrode potential is a solution in which a metal salt exemplified above is dissolved or dispersed. The solvent is preferable to dissolve a metal salt with a lower normal electrode potential therein but not a polysilane. Although it cannot be said in general due to the different solubility depending on the types of side chain groups, the polymerization degree, the above-mentioned solvent to be preferable includes non-protonic polar solvents, for example, water, ketones such as acetone and methyl ethyl ketone, esters such as ethyl acetate, alcohols such as methanol and ethanol, and amides such as dimethylformamide, dimethyl sulfoxide, and hexamethyl phosphoric triamide, nitromethane, acetonitrile and the like. In the case of using polymethylphenylsilane as a polysilane, alcohol such as ethanol is especially preferably used. The use amount of the solvent is adjusted so as to keep the concentration of a metal salt with a lower normal electrode potential or metal colloid in a range of preferably 0.1 to 50% by weight, more preferably 1 to 20% by weight.

Next, an electroless plating solution is brought into contact with the parts where the metal particles are adsorbed to deposit a metal by electroless plating and form metal wiring.

As the electroless plating solution, those containing a metal ion of, for example, copper, nickel, tin, palladium, silver, gold, platinum, rhodium and the like are preferably used. The electroless plating solution is in general, an aqueous metal salt solution of the above-mentioned metal ion mixed with a reducing agent such as sodium hypophosphite, hydrazine, boron sodium hydride and the like and a chelating agent such as sodium acetate, phenylenediamine, and potassium sodium tartrate, is commonly sold in markets as an electroless plating solution and easily and economically made available.

A method for bringing the electroless plating solution into contact with the silicon-based material layer, similarly to the above-mentioned case of bringing the solution containing a metal salt with a lower normal electrode potential, preferably involves a step of immersing the silicon-based material layer together with the substrate into the electroless plating solution. The temperature for contacting with the electroless plating solution is preferably 15 to 120° C., further preferably 25 to 85° C. The contact duration is, for example, from 1 minute to 16 hours, preferably about 10 to 60 minutes.

The thickness of a metal film to be formed by the electroless plating solution is preferably sufficient to fill the recessed parts of the photosensitive layer. Accordingly, metal circuit patterns with smooth surface can be formed. Further, in some cases, a metal may be deposited in the inner wall faces of the recessed parts without fully filling the parts with the metal. Of course, depending on the applications, the metal patterns may be projected out of the surface and utilized, for example, as bumps for connection.

The thickness of the metal film and the depth of the recessed parts of the photosensitive layer are generally about 0.01 to 100 $\mu$m, preferably about 0.1 to 20 $\mu$m.

[Formation of Dielectric Material Doped Part]

In the present invention, energy beam such as UV rays is radiated to a silicon-based material layer and a metal oxide having a high dielectric constant is adsorbed in the exposed parts to form dielectric material doped parts. In the exposed parts, silanol groups are formed in such a manner as described above, so that the surface state is changed to be from non-polar to polar and made hydrophilic. When the exposed parts made hydrophilic are brought into contact with an aqueous solution in which a metal oxide is dispersed, the silicon-based material layer is swollen in the aqueous solution and metal oxide particles are dispersed in the silicon-based material layer and adsorbed therein. Since the silicon-based material layer in the unexposed parts is hydrophobic, the particles are not dispersed in the silicon-based material and easy to be removed by washing.

After the adsorption of the metal oxide, the hydrophilic parts in the silicon-based material layer can be changed to be hydrophobic by heating. Therefore, after the doping with the metal oxide, the metal oxide can be fixed in the silicon-based material by heating. In general, by heating treatment at 300° C. or higher is formed dielectric material doped parts containing the metal oxide and having a high dielectric constant. The dielectric material doped parts with a high dielectric constant can be used as built-in type electronic parts such as capacitors and the like.

As the metal oxide to be used for forming the dielectric material doped parts, a variety of materials including metal oxides with relatively low dielectric constants such as alumina, zirconia, and titania and metal oxides with relatively high dielectric constants such as tantalum oxide and barium titanate can be employed. Using a surfactant or a dispersed resin based on the necessity, the metal oxide is dispersed to have an average particle diameter of 200 nm or smaller, preferably 100 nm or smaller, in an aqueous solution. Further, for the purpose to swell the silicon-based material layer in the exposed parts in the case of contacting the layer with an aqueous metal oxide solution, alcohol may be added in a concentration of 1 to 40% by weight, preferably 10 to 20% by weight, to the aqueous solution. Practically, methanol, ethanol, isopropanol (IPA), ethylene glycol can be used. The method for contacting with a dispersion of the metal oxide is preferably a method involving a step of immersing the silicon-based material layer together with the substrate in a dispersion in which the metal oxide is dispersed. The duration of the immersion is not particularly limited, however immersion is carried out for, for example, about 1 second to 60 minutes. After immersion, drying is carried out generally at 10° C. to 200° C. in normal or reduced pressure. Other than the method by immersion, a dispersion in which the metal oxide is dispersed may be blown selectively to the exposed parts of the silicon-based material layer by using an ink jet head.

EXAMPLES

Hereinafter, the present invention will be described practically with reference to Synthetic examples and Examples, however it is not intended that the present invention be limited to the illustrated examples.

SYNTHESIS EXAMPLE OF POLYSILANE

A flask of 1,000 ml volume equipped with a stirring means was filled with toluene 400 ml and 13.3 g of sodium. The contents in the flask were heated to 111° C. in a yellow room where UV rays were shielded and stirred at a high speed to finely disperse sodium in toluene. Further, 42.1 g of phenylmethyldichlorosilane and 4.1 g of tetrachlorosilane were added and stirred for 3 hours to carry out polymerization. After that, ethanol was added to the obtained reaction mixture to inactivate excess sodium. After washing with water, the separated organic layer was poured in ethanol to precipitate a polysilane. The obtained low grade polysilane was repeatedly precipitated in ethanol three times to obtain branched type polymethylphenylsilane, which is a branched type polysilane with a weight average molecular weight of 11,600.

EXAMPLES

The branched type polysilane obtained in the above-mentioned synthesis example 100 parts by weight, DC-3037 (methylphenylmethoxysilicone resin, produced by Dow Corning Corp.) 50 parts by weight, and BTTB (3,3',4,4'-tetra-(tert-butylperoxycarbonyl)benzophenone, produced by Nippon Oil & Fats Co., Ltd.) 15 parts by weight were dissolved in toluene 1,215 parts by weight to produce a photosensitive resin composition. The photosensitive resin composition was applied in a thickness of 20 $\mu$m to a glass substrate by using a spin coater, dried at 120° C. for 10 minutes in an oven, further dried at 200° C. for 30 minutes and 300° C. for 30 minutes to form a lower clad layer with a refractive index of 1.54.

Next, branched type polysilane obtained in the above-mentioned synthesis example 100 s part by weight, DC-3074 (methylphenylmethoxysilicone resin, produced by Dow Corning Corp.) 50 parts by weight, and BTTB 15 parts by weight were dissolved in toluene 1,215 s part by weight to produce a photosensitive resin composition. The photosensitive resin composition was applied in a thickness of 20 $\mu$m to a glass substrate, in which the lower clad layer was formed, by using a spin coater and dried at 120° C. for 10 minutes in an oven to form a silicon-based material layer to be a core layer and side face clad layer.

Next, a photomask with core patterns of 10 $\mu$m width was put thereon and UV rays with 313 nm wavelength and intensity dose of 4,000 mJ/cm$^2$ were radiated by employing a 500 W mercury lamp. After that, drying was carried out at 200° C. for 30 minutes and 300° C. for 30 minutes. The exposed parts subjected to the UV ray radiation had a refractive index of 1.53 and the unexposed parts which were not subjected to the UV ray radiation had a refractive index of 1.57. Accordingly, the core layers and side face clad layers with 10 $\mu$m width were formed with excellent pattern precision.

Next, the same photosensitive resin composition as that used for the lower clad layer formation was applied in a thickness of 20 $\mu$m on the core layers and the side face clad layers by using a spin coater and then dried at 120° C. for 20 minutes to form an upper clad layer.

Next, a photomask with wiring patterns of 20 $\mu$m width was put on the upper clad layer and UV rays with 313 nm wavelength and intensity dose of 2,000 mJ/cm$^2$ were radiated by employing a 500 W mercury lamp. Successively, the resulting substrate was immersed in a TMAH solution containing 20% by weight of isopropanol at 23° C. for 5 minutes and then washed with pure water and after that, drying was carried out at 100° C. for 10 minutes. In such a manner, the exposed parts were developed and recessed parts were formed in the upper clad layer. The depth of the formed recessed parts was measured by a probe type film thickness sensor Dektak 3 ST to find it 7.5 $\mu$m.

Next, the substrate in which the recessed parts were formed was immersed in a solution of 20% by weight of ethanol containing 20% by weight of silver nitrate for 5 minutes and washed with pure water to remove the aqueous silver nitrate solution adhering to the unexposed parts. After that, drying was carried out at 100° C. for 10 minutes. Accordingly, silver colloid latent images of silver colloid were formed on the surface of the recessed parts.

Next, the resulting substrate was immersed in an electroless copper plating solution OPC-700 at 25° C. for 240 minutes to deposit metal films of copper in the recessed parts and form metal wiring in the recessed parts. The film thickness of the metal wiring was 7.2 $\mu$m. The formed metal wiring had excellent copper luster. Incidentally, the electroless copper plating solution OPC-700 is an electroless copper plating solution produced by Okuno Chemical Industries Co., Ltd. by adding 100 ml of OPC-700 electroless copper plating M-A, 100 ml of OPC-700 electroless copper plating M-B solution, and 2 ml of OPC-700 electroless copper plating M-C to 798 ml of deionized water.

Next, a photomask having patterns of dielectric material doped parts of 20 $\mu$m width was put on the portions other than the foregoing metal wiring of the upper clad layer and UV rays with 313 nm wavelength and intensity dose of 4,000 mJ/cm$^2$ were radiated by employing a 500 W mercury lamp.

Successively, the resulting substrate was immersed in a barium titanate dispersion in which non-volatile component concentration was adjusted to be 15% by weight (BT-16 slurry, produced by Cabot Corp.) at 30° C. for 30 minutes to adsorb barium titanate in the exposed parts of the upper clad layer and form the dielectric material doped parts. Next, the resulting substrate was washed with pure water and dried at 120° C. for 10 minutes. In this case, the film thickness was 5 $\mu$m. Next, the substrate was subjected finally to heating at 300° C. for 30 minutes.

The optoelectronic packaging substrate obtained through the above-mentioned steps had excellent transparency and films were not peeled off even by rubbing.

The conductivity of the metal wiring portions of the obtained substrate was measured to find it 7×10$^5$ S/cm. Further, the adhesion strength of the metal wiring portions was measured by peeling strength measurement to find that the adhesion strength was also as high as 0.9 kgf/cm or higher.

Further, the specific inductive capacity of the upper clad layer was measured by a capacitor method to find that it was 2.8 at 1 MHz and the film had a low dielectric constant. On the other hand, the specific inductive capacity of the dielectric material doped part was measured to find it 50.

Also was measured the waveguide loss of the optical waveguide by a cut-back method to find that the waveguide loss was about 0.08 dB/cm with light with wavelength of 1,550 nm and confirm that the loss of the optical waveguide had extremely low.

According to the present invention, an optoelectronic packaging substrate having optical wiring and electric wiring with excellent patterning precision and excellent in flatness and heat resistance can be obtained. Consequently, the substrate can be employed in a wide range in electric, electronic, and communication fields and is especially useful as a multilayer substrate and a substrate for integrated circuits. The substrate may be applied also to a semiconductor multi-chip module, an optically printed substrate and the like.

What is claimed is:

1. An optoelectronic packaging substrate comprising optical wiring having an optical waveguide and electric wiring of metal wiring, wherein the optical waveguide is composed of a core layer, a side face clad layer formed in the side circumference of the core layer, an upper clad layer formed on the upper side of the core layer and the side face clad layer, and a lower clad layer formed on the lower side of the core layer and the side face clad layer;

the metal wiring is formed in at least one of the side face clad layer, the upper clad layer, and the lower clad layer; and the core layer, the side face clad layer, and the clad layer bearing the metal wiring are made of a silicon-based material layer of a branched type polysilane mixed with a silicone compound.

2. The optoelectronic packaging substrate according to claim 1, wherein the core layer and the side face clad layer are formed by exposing selectively the region corresponding to the side face clad layer in the silicon-based material layer so as to make the refractive index in the region lower than that in the region corresponding to the core layer.

3. The optoelectronic packaging substrate according to claim 1, wherein the metal wiring is formed by depositing a metal on a clad layer by electroless plating.

4. The optoelectronic packaging substrate according to claim 3, wherein the metal wiring is formed by exposing selectively a region to form the metal wiring therein, adsorbing a metal with a lower normal electrode potential than that of the metal to be deposited by the electroless plating on the region, and then depositing the metal on the region by electroless plating.

5. The optoelectronic packaging substrate according to claim 4, wherein the metal wiring is formed by forming a recessed part by developing and etching the selectively exposed part and depositing a metal in the recessed part by electroless plating.

6. The optoelectronic packaging substrate according to claim 1, wherein dielectric material doped part adsorbing a metal oxide with a high dielectric constant is formed in at least one of the side face clad layer, the upper clad layer, and the lower clad layer and the clad layer having the dielectric material doped part therein is a silicon-based material layer of a branched type polysilane mixed with a silicone compound.

7. The optoelectronic packaging substrate according to claim 6, wherein the dielectric material doped part is formed by exposing selectively the region to form the dielectric material doped part therein and adsorbing the metal oxide selectively in the region.

8. The optoelectronic packaging substrate according to claim 1, wherein the silicon-based material layer further contains a photosensitive acid generating agent.

9. The optoelectronic packaging substrate according to claim 8, wherein 1 to 5.5% by weight of the photosensitive acid generating agent is contained in the polysilane.

10. The optoelectronic packaging substrate according to claim 1, wherein the silicon-based material layer further contains a peroxide.

11. The optoelectronic packaging substrate according to claim 10, wherein 1 to 10% by weight of the peroxide is contained in the polysilane.

12. The optoelectronic packaging substrate according to claim 1, wherein 40 to 90% by weight of the silicone compound is contained in the polysilane in the silicon-based material layer.

13. The optoelectronic packaging substrate according to claim 1, wherein the lower clad layer is formed on a substrate or a sheet made of a semiconductor, glass, a magnetic body, a plastic or a their compound material.

14. An optoelectronic packaging substrate production method for producing an optoelectronic packaging substrate according to one of the claims 1 to 13, wherein the method involves steps of forming a silicon-based material layer of a branched type polysilane mixed with a silicone compound on a lower clad layer;

exposing a selected part of the silicon-based material layer to make the exposed part be a side face clad layer and the unexposed part be a core layer;

forming an upper clad layer on the side face clad layer and the core layer; and forming metal wiring with a prescribed pattern by depositing a metal on at least one of the lower clad layer, the side face clad layer, and the upper clad layer by electroless plating after formation of the clad layer and before formation of another layer thereon.

15. The optoelectronic packaging substrate production method according to claim 14, wherein the metal wiring is formed by exposing selectively a region to form the metal wiring thereon, selectively adsorbing a metal with a lower normal electrode potential than that of a metal to be deposited by electroless plating on the region, and then depositing the metal selectively on the region by electroless plating.

16. The optoelectronic packaging substrate production method according to claim 15, wherein the metal wiring is formed by forming a recessed part by developing and etching the selectively exposed part by using an organic solvent or an alkaline solution and depositing a metal in the recessed part by electroless plating.

17. The optoelectronic packaging substrate production method according to claim 14, wherein the method further involves a step of forming a dielectric material doped part adsorbing a metal oxide having a high dielectric constant in at least one of the lower clad layer, the side face clad layer, and the upper clad layer after formation of the clad layer and before formation of another layer thereon.

18. The optoelectronic packaging substrate production method according to claim 17, wherein the dielectric material doped part is formed by exposing selectively a region to form the dielectric material doped part thereon and selectively adsorbing a metal oxide in the region.

19. The optoelectronic packaging substrate production method according to claim 14, wherein the method further involve a step of forming the lower clad layer on a substrate or a sheet of a semiconductor, glass, a magnetic body, a plastic or a their compound material.

* * * * *